United States Patent [19]
Caillat et al.

[11] Patent Number: 5,450,206
[45] Date of Patent: Sep. 12, 1995

[54] PROCESS AND DEVICE FOR CHECKING THE CONFORMITY OF HYBRIDIZATION BALLS

[75] Inventors: Patrice Caillat; Guy Parat, both of Echirolles; Gérard Nicolas, Voreppe, all of France

[73] Assignee: Commissariata l'Energie Atomique, Paris, France

[21] Appl. No.: 242,607

[22] Filed: May 13, 1994

[30] Foreign Application Priority Data

Jun. 1, 1993 [FR] France .................. 93 06515

[51] Int. Cl.⁶ ........................................ G01B 11/00
[52] U.S. Cl. .................................... 356/394; 356/237
[58] Field of Search ............... 356/375, 376, 394, 237; 73/104, 800, 865.8; 348/87, 92, 125, 126

[56] References Cited

U.S. PATENT DOCUMENTS

| | | | |
|---|---|---|---|
| 4,803,871 | 2/1989 | Harada et al. | 356/376 |
| 4,864,122 | 9/1989 | Masaaki et al. | |
| 5,131,753 | 7/1992 | Pine et al. | 356/375 |

FOREIGN PATENT DOCUMENTS 0066694 12/1982 European Pat. Off.
3824097 1/1989 Germany.

OTHER PUBLICATIONS

NTIS Tech Notes, Jun., 1990, p. 500, 'Measuring Gaps in O-Ring Seals'.
IBM Technical Disclosure Bulletin, vol. 29, No. 2, Jul., 1986, pp. 781–782, 'Surface-Mounted Component Lead Co-Plararity Mesurement Tool'.
Research Disclosure, No. 333, Jan., 1992, p. 13, 'Solder Ball Connection Co-Planarity With X-Ray Technology'.
French Search Report—FA 490305—FR 9306515—Feb. 4, 1994.

Primary Examiner—Hoa Q. Pham
Attorney, Agent, or Firm—Pearne, Gordon, McCoy & Granger

[57] ABSTRACT

A process for checking the conformity of hybridization balls present on a chip or a substrate and its implementation device are provided. The process includes positioning the hybridization balls of the electronic component or substrate near a strip transparent to a predetermined wavelength. The hybridization balls are partially flattened against the strip by positioning the electronic component or substrate at a previously defined distance from the transparent strip. The previously defined distance corresponds to a theoretical reference ball height less an acceptable deviation between the theoretical reference ball height and a minimum height of the hybridization balls. The partial flattening creates ball flats on the hybridization balls at the strip. The hybridization balls are illuminated with a light beam of the predetermined wavelength that is emitted through the strip. A portion of the light beam reflected back through the strip by the hybridization balls to be checked and is acquired. Finally, conformity or nonconformity of the hybridization balls to be checked is determined as a function of the portion of said light beam reflected back by each of the hybridization balls.

11 Claims, 3 Drawing Sheets

PROCESS AND DEVICE FOR CHECKING THE CONFORMITY OF HYBRIDIZATION BALLS

BACKGROUND OF THE INVENTION

1. Field of the Invention

The present invention relates to a process making it possible to control or check the conformity of hybridization balls, particularly of a chip, a chip package, or a substrate. The term conformity of the balls means that the balls have a height between a minimum height (hmin) and a maximum height (hmax). It also relates to a device for implementing said process. It has applications in the fields of microelectronics, data processing and airborne electronics.

2. Description of Prior Art

A procedure for the transfer of electronic components to an interconnection substrate making use of microbosses, protuberances or balls is known to one skilled in the act. This transfer procedure is called flip-chip. According to the flip-chip procedure, the microbosses are made from a meltable material deposited by electrolysis or evaporation, e.g. on the connecting pads of the inputs/outputs of the electronic component. This meltable material can e.g. be indium or a tin-lead alloy. The operation of transferring the electronic component to the substrate takes place at a heating temperature at least corresponding to the melting point of the chosen meltable material. This transfer operation can be likened to a brazing operation.

Such a transfer process is known as C4 (which means Control Collapse Chip Connection). This process has formed the subject of numerous publications and is in particular described in "Micropackaging Handbook" by TUMMALA.

The evermore frequent use of multi-chip modules implies an optimization of the useful substrate surface. It is for this reason that the flip-chip procedure is the most widely used in the case of modular multi-chips. It is more particularly used in wide circulation sectors, where vital significance is attached to costs. The latter constraints have led to the development of processes for producing balls based on electrolysis and which are more economic than the conventional processes using evaporation.

Such electrolysis processes suffer from a major disadvantage namely the difficulty of obtaining a perfect homogeneity of the dimensions of the balls and more particularly their height.

The chips provided with their balls are then assembled with a substrate by deposition on the latter. The following stage consists of a thermocompression (heating+pressure) or a solder reflow, i.e. a heating only of the chip-microball-substrate assembly.

As a result of the pressure exerted, the chip thermocompression operation makes it possible to accept a certain inhomogeneity with respect to the height of the balls prior to assembly. However, this process is individual. This means that it is successively applied to each of the chips deposited on the substrate. Thus, each chip is individually pressed and heated, which for the production of a multichip module (possibly having some 120 chips) requires a very long assembly time. Moreover, it is difficult to ensure a pressure distribution with respect to the balls over chips having a very large number of inputs/outputs without deteriorating the requisite precise positioning.

The solder reflow process is faster to carry out and is therefore less onerous. However, the tolerance of this process is lower with respect to ball height inhomogeneities. It is therefore necessary to check the height of the balls. Different methods have been developed in the industry for checking the presence and the size of the hybridization balls of chips prior to assembly on a substrate.

In most industrial applications, the balls to be checked have a size between 20 and 150 $\mu$m and said check must take place with a resolution of approximately 5%. Moreover, for productivity reasons, such a ball size check must take place at a speed close to 150 ms/ball.

A first method consists of high resolution image analysis. This method makes use of a system dedicated to the checking of the masks used in silicon integrated circuit production workshops and operating in planar manner. The resolution obtained by this first method is below 1 micron. However, tests carried out on non-planar structures (which includes balls) demonstrate a speed which is incompatible with the rates used for the checking of hybridization balls in the industry.

A second method uses an autofocussing system able to focus on the one hand on the top of the ball and on the other on the substrate. This method makes it possible to obtain the profile of the balls at a speed of approximately 1 second per ball. However, the obtaining of a complete profile of the balls is not necessary for checking the size of the balls. Moreover, the rate permitted by this method is far from the desired speed of 150 ms/ball.

A third method makes use of microprofilometers such as those used in the semiconductor industry for checking the thicknesses of deposits. These apparatuses make use of the displacement of a light pen on the structures to be measured. An adaptation of these microprofilometers to the checking of the size of balls has been envisaged. However, for very soft material such as indium, the marking of the ball and the dirtying of the light pen are not insignificant. Moreover, the positioning of the light pen must be very accurate and the checking speed which can be attained is not compatible with that required.

A fourth method consists of a laser triangulation. This method, which has the advantage of being very accurate, is complex to perform and too slow to be compatible with the desired speed of 150 ms/ball.

Finally, a fifth method consists of analyzing a projected shadow. According to this method, the analyzing image is the shadow of the ball obtained by a 45° incident illumination. The interest of this method is the "enlargement" of the observed subject. However, as the definition obtained is linked with the topology and the cleanness of the chip surface, said method requires a readjustment of the contrast for each check or control. It can therefore only be of interest for a single surface state. It becomes very complex when there are several surface states.

SUMMARY OF THE INVENTION

The present invention aims at obviating these disadvantages. For this purpose, it proposes a process making it possible to rapidly check the presence and/or size of balls fitted, particularly according to the solder reflow procedure, on a chip or substrate. This process consists of using marked contrasts, created by illuminating each of the balls to be checked, between a light flat created on the ball to be checked and the remainder of the checked optical field. It then consists of analysing these contrast differences by comparison.

More specifically, the invention relates to a process for checking the conformity of the hybridization balls present on one face of an electronic component or a substrate. It is characterized in that it consists of the following stages:

a) positioning the hybridization balls of the electronic component or substrate against a strip transparent to the wavelength λ, b) partial flattening of said hybridization balls on the transparent strip, said flattening creating ball flats on the strip, c) illuminating the balls with a light beam of wavelength λ through the transparent strip, d) acquisition of the signal reflected by the hybridization balls to be checked, e) determination of the respective conformity or non-conformity of the hybridization balls to be checked as a function of the signal reflected by each of them.

According to a first embodiment of the invention, stage c) consists of illuminating the entire electronic component or substrate by the light beam and stage d) consists of acquiring the signal reflected by said assembly.

According to a second embodiment of the invention, stage c) consists of illuminating part of the electronic component or substrate by the light beam, said part being able to have at least one ball and stage d) consists of acquiring the corresponding reflected signal, said stages c) and d) being repeated so as to check the complete electronic component or substrate.

According to an embodiment of the invention, stage e) of determining the conformity of the balls consists of detecting, from the acquired reflected signal, the presence or absence of a flat linked with a ball, respectively at the different locations liable to be occupied by the balls.

Advantageously, these locations are predefined in a data base and stored in processing means of the implementing device.

According to another embodiment according to the invention, the stage e) of determining the conformity of the balls consists of detecting, from the acquired reflected signal, at the different locations liable to be occupied by the balls, the presence or absence of a flat and measuring, in the case when a flat is detected, the size of said flat.

According to an embodiment of the invention, the stage b) of flattening the hybridization balls against the transparent strip consists of positioning the electronic component or substrate at a previously defined distance from the transparent strip, said distance corresponding to a theoretical reference ball height, less the acceptable deviation between said theoretical ball height and the minimum height of the hybridization ball to be checked in order for the latter to be of a conforming nature.

The present invention also relates to a device for performing this process and which comprises:

a strip transparent to the wavelength λ, a loading table on which is placed the electronic component or substrate, the face of said electronic component or substrate on which are located the hybridization balls facing the transparent strip, displacement means (such as e.g. a piston) for displacing the loading table in a direction Z in order to ensure the partial flattening of the hybridization balls against the transparent strip, optical means for emission and acquisition respectively of a light beam of wavelength λ able to illuminate the hybridization balls to be checked through the transparent strip and a light beam reflected through the transparent strip by the electronic component or substrate and the hybridization balls, orientation means (such as e.g. a precision table) for orienting the optical means or table in accordance with the directions X and Y in order to direct the light beam towards the hybridization balls to be checked, processing means (or control system) able to control the orientation means and displacement means and determine the conformity or non-conformity of the hybridization balls to be checked.

According to a preferred embodiment of said device, the strip transparent at the wavelength λ has a first plate transparent to said wavelength λ and a second plate transparent to the wavelength λ deposited on the first plate, the latter having a smaller thickness than the second plate and having a dulled or frosted face, in contact with the second plate, the other face of the first plate being in contact with the balls.

According to the invention, the optical means incorporate an axial light source ensuring the illumination of the hybridization balls to be checked and a CCD camera coupled to said light source in order to acquire the reflected signal.

DETAILED DESCRIPTION OF THE PREFERRED EMBODIMENTS

Figure 1:
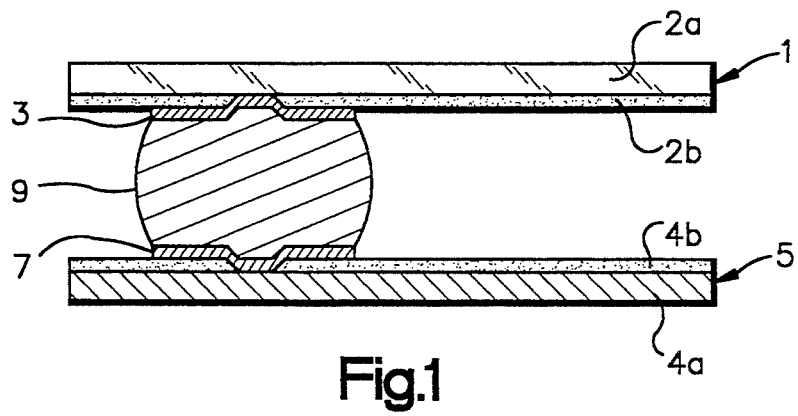
FIG. 1, already described, shows a hybridization ball of a chip fitted to a substrate.

FIG. 1 shows in a front view a hybridization ball ensuring the connection between a chip 1 and a substrate 5. More specifically, the chip 1 has an electrically conductive material coating 2a in contact with the connecting pad 3. An electrically insulating coating 2b covers the lower face of the coating 2a around the output pad 3. FIG. 1 also shows the substrate 5 having an electrically conductive material coating 4a in contact with the connecting pad 7. An electrically insulating coating 4b covers the coating 4a around the connecting pad 7. The hybridization ball 9 ensures the electrical connection between the connecting pad 3 of the chip 1 and the connecting pad 7 of the substrate 5.

Figure 2:
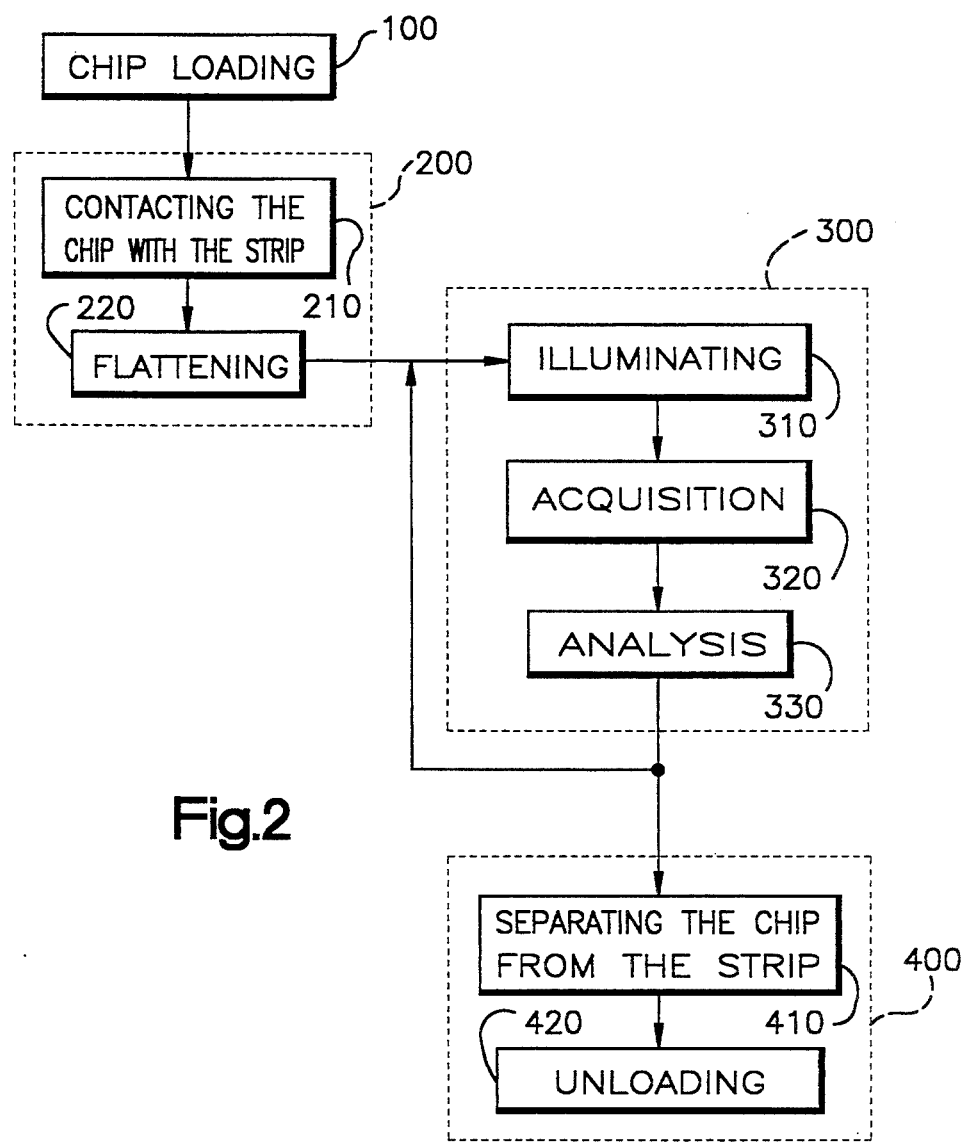
FIG. 2 shows the operating diagram of the process according to the invention.

FIG. 2 shows the operating diagram of the process according to the invention. This process involves a first stage 100 of loading the device (chip or substrate) having the balls. In the remainder of the description and in non-limitative manner, the particular case of a chip will be used. Stage 100 consists of loading the chip, whereof it is wished to check each of the balls in the implementation device to be described hereinafter. Therefore the chip is placed in the device in such a way that its hybridization balls face the strip transparent to the wavelength λ.

In stage 200 of the process according to the invention, the chip can be positioned with respect to the transparent strip. More specifically, stage 200 involves a first substage 210, which consists of contacting the hybridization balls of the chip with the transparent strip, in such a way that a first contact is established between the balls and the transparent strip. A second substage 220 consists of refining the positioning of the chip with respect to the strip, i.e. more precisely for the at least partial flattening of the hybridization balls of the chip against the strip. The flattening 220 of the hybridization balls on the transparent strip is controlled by automatic control means in such a way that the flattening of the balls is in accordance with the quality criteria desired by the user.

The process according to the invention also consists of a stage 300 of checking the conformity of each of the balls of the chip to be checked. This stage 300 involves a first illuminating substage 310. This substage 310 consists of illuminating all or part of the chip with the balls by a light beam of wavelength λ delivered in a direction perpendicular to the optical field to be checked. This field can have one or more balls (a field with a single ball being used hereinafter). When the field is limited to part of the chip, the process according to the invention is repeated in such a way as to check the complete chip by other optical fields. The emitted light beam is reflected by the illuminated chip part (particularly the ball and its flat) and thus supplies a reflection signal acquired in the substage 320. On the basis of the acquired reflection signal, an analysis is performed for detecting the presence of the flat and/or for calculating the size of the ball flat during the check, the flat size being, as will be shown hereinafter, directly related to the size of the actual ball. This analysis stage is designated 330. When the size of the flat of the ball to be checked has been calculated, a conformity test (stage 330) makes it possible to check whether the size of the given flat corresponds to the size of the flat of a ball considered to conform. If this conformity test with respect to the flat is validated, then the ball is considered to conform. Conversely, when the flat size conformity test is not validated, the ball is considered not to conform.

In the embodiment of the invention consisting of the detection of the presence of conform balls, this conformity of the balls is checked by means of a rejection criterion solely relating to the minimum size required of the balls. In this case, the minimum ball size can be checked by detecting the presence of a flat on each ball. More specifically, the criterion is considered to be the rejection of the balls whose size is less than n micrometers with respect to the standard or theoretical size. In this case, the process consists of flattening on n micrometers the said balls on a transparent strip. The balls having a flat are considered to conform, whereas those having no flat are smaller than the minimum height defined by the standard size less the flattening of n micrometers and are therefore considered not to conform. Stage 300 is performed for each of the balls of the chip.

When the last ball of the chip has been checked, no matter whether it is conforming or non-conforming, a stage 400 is performed for removing the chip from the device. This stage 400 more specifically consists of a first substage 410 of separating the chip from the strip. Thus, when the hybridization balls of the chip have been flattened on the transparent strip, the disengagement of the latter from the balls of the chip is performed during substage 410. When the chip has been separated from the transparent strip, it can be unloaded from the device, so that optionally a second chip can be loaded onto the device for checking.

Figure 3:
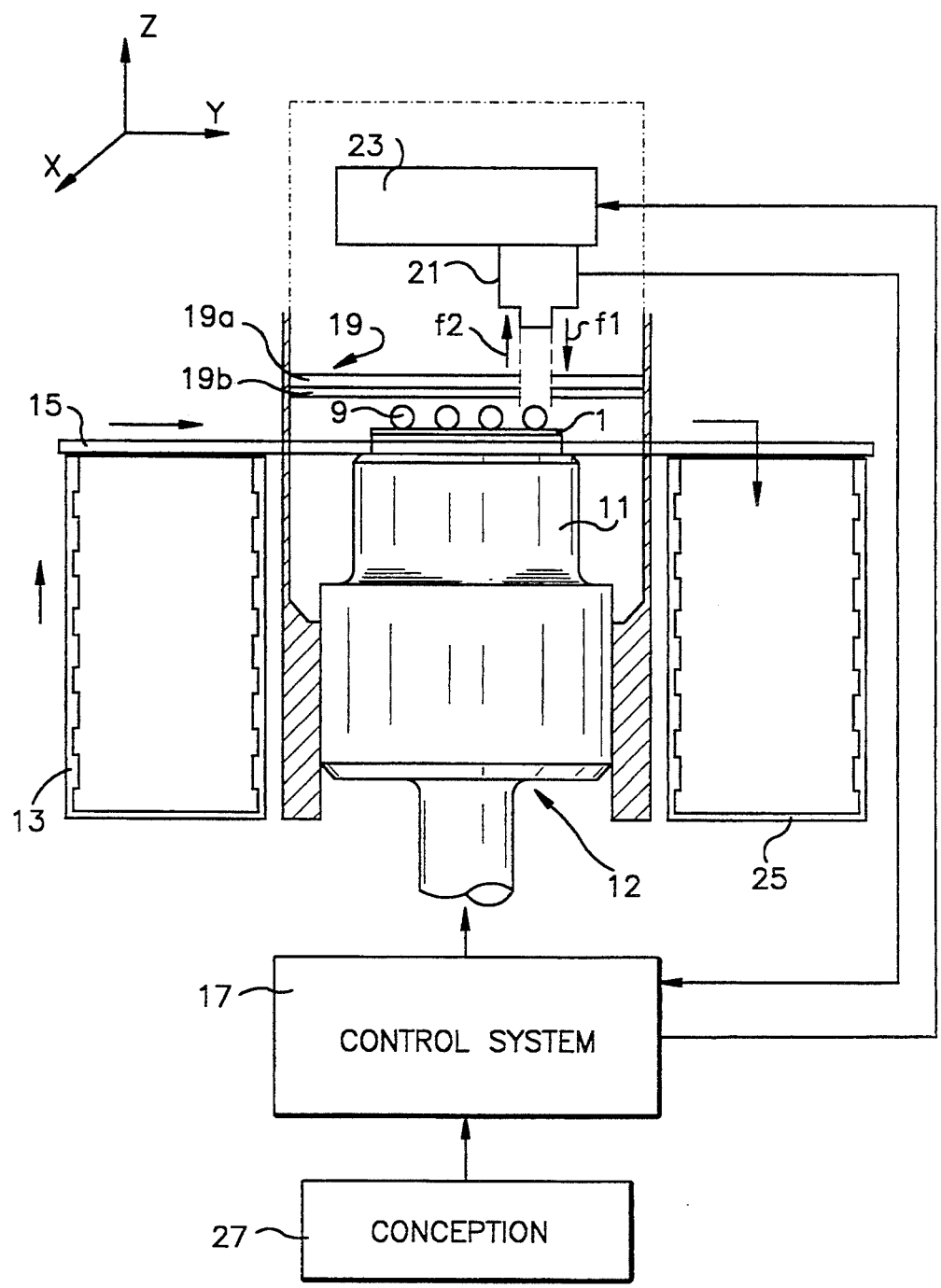
FIG. 3 diagrammatically shows the device for checking the height of the balls of a chip.

FIG. 3 shows the device permitting the performance of the process described in FIG. 2. This device has a loading table 11 on which is deposited the chip 1 to be checked. The loading and unloading of the chip can take place automatically by a conventional microelectronics loading/unloading system 13. In order to permit the flattening of the balls 9, said device has a strip 19 transparent to the wavelength emitted by the optical means to be described hereinafter.

According to a preferred embodiment of the invention, the transparent strip 19 has a first and a second transparent plate, the first plate 19b having a thickness less than that of the second plate 19a having a slight frosting or dulling on one of its faces. The face of the first plate 19b having said frosting is placed against the second plate in such a way that the face of the first plate against which are flattened the balls is smooth. The second plate 19a makes it possible to rigidify the assembly, said second plate being able to "collect" the pressure exerted by the flattening of the balls on the first plate 19b.

The frosting makes it possible to accentuate the contrast between the flats and the remainder of the observed field. In this embodiment, said transparent strip 19 has a fixed position in the device. The loading table 11 is mobile and ensures the contacting and then the flattening of the balls 9 of the chip 1 against the transparent strip 19. More specifically, said loading table 11 can be translated in the direction Z e.g. by means of a piston 12 moving in the direction Z.

According to an embodiment of the invention, said loading table 11 is fixed to the piston 12. This piston 12 movable in direction Z is controlled by a control system 17 described in greater detail hereinafter.

According to another embodiment of the invention, the piston 12 movable in direction Z forms an integral part of the loading table 11, which can then move in the direction Z as a function of controls given by the control system 17.

The device according to the invention also has optical means 21 consisting of the association of a light source able to axially illuminate the ball or balls 9 of the chip 1 facing said means with a photodetection means (e.g. a CCD camera or a photodiode) able to detect the response signal. The term reflection signal is understood to mean the signal resulting from the reflection of the light beam supplied by the light source to the ball or balls 9 during the checking operation and on its flat. The dotted line in FIG. 3 between the optical means 21 and the ball 9 being checked represent the light beam. On either side of said light beam it is possible to see the direction of said beam which is represented by arrows. The light beam is directed in accordance with the arrow f1 when projected by the light source of the optical means 21 towards the ball or balls 9 to be checked. The light beam is reflected towards the photodetector means of the optical means 21 in accordance with the arrow f2, when the light beam in accordance with arrow f1 has been reflected on the ball or balls 9 and the chip 1.

A precision table in X and Y designated 23 is coupled to the optical means 21 so as to permit the displacement of the latter. This precision table 23 is controlled by the control system 17 in directions X and Y. This control system 17 has a memory in which are stored the theoretical position of each ball of the chip 1. It can therefore control the displacement of the precision table 23 above the chip 1 to be checked. This precision table 23 makes it possible to position the optical means 21 vertically above the ball or balls 9 chosen for checking purposes.

When all the balls 9 of the chip 1 have been checked in the manner explained by stage 300 of FIG. 2, the chip 1 is discharged from the loading table 11. This discharge of the chip 1 out of the table 11 takes place in a similar manner to its loading onto the table 11.

As stated hereinbefore, the control system 17 ensures the control of the displacement of the piston 12 moving in direction Z, the control of the displacement of the precision table in directions X and Y, the control of the loading and unloading of the chip to be checked respectively onto and from the table 11. This control system 17 also ensures the processing of data, i.e. the detection and/or calculation of the size of the detected flat on the ball 9 being checked. This control system 17 also ensures the conformity testing of the ball 9. Thus, the control system 17 is able to carry out the acquisition of data supplied by bands or strips 27, which have the data relative to the chip to be checked (theoretical position of the balls, maximum and minimum height of standard or theoretical balls). It can also carry out the acquisition of the data supplied by the photodetection means of the optical means 21 on the basis of which it performs the detection and/or calculation of the size of the flats.

Figure 4A:
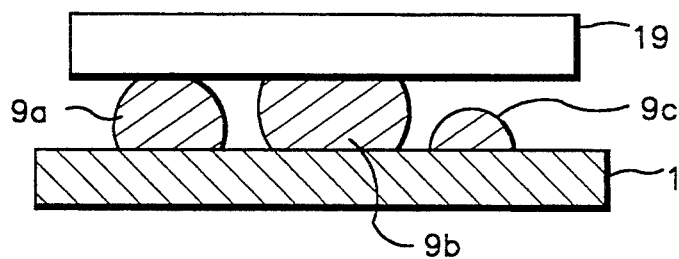
FIG. 4A and 4B shows a chip hybridized by balls of different sizes and the curve of the response signal corresponding to each of these balls.
Figure 4B:
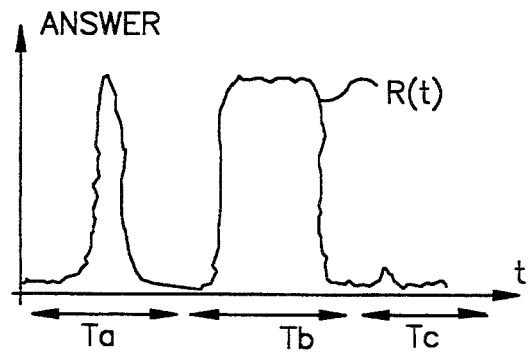

FIG. 4 shows in part A a chip hybridized by three balls, all three having different sizes. In part B is shown a curve representing the response signal obtained for each of these three balls.

More specifically, part A shows the transparent strip 19, the chip 1 and the three hybridization balls successively 9a, 9b and 9c. According to FIG. 4, the hybridized chip 1 has been moved towards the transparent strip 19 as a function of a conformity criterion chosen by the user. Therefore this approach has flattened certain of the balls of the chip 1 and has therefore created flats thereon, said balls being 9a and 9b. As ball 9c is much smaller than balls 9a and 9b, the approach of the chip 1 to the transparent strip 19 does not give rise to any levelling of said ball 9c.

Part B of FIG. 4 shows the response signal of the reflection signal obtained by the CCD camera (or photodiode, as a function of the chosen embodiment). On said curve on the abscissa axis is represented the time t and on the ordinate axis the response signal recorded during the displacement of the optics along the axis of the balls. During the period Ta, it is possible to read the response obtained by the CCD camera for the ball 9a. In the same way during the period Tb it is possible to read the response obtained by the CCD camera for the ball 9b. Identically, the period Tc shows the signal obtained for the ball 9c.

Part A of FIG. 4 clearly shows the great inhomogeneity of the heights of the balls 9a, 9b and 9c. Part B of FIG. 4 represents the analysis performed on the basis of the reflection signal obtained for each of these balls. This curve R(t) shows that the inhomogeneity of the balls 9a and 9b can be evaluated as acceptable or unacceptable as a function of criteria chosen by the user, whilst the ball 9c is necessarily considered unacceptable, i.e. non-conforming, because its response signal is virtually non-existent. Thus, the defect of the ball 9c can be easily detected, which generally leads to the rejection of the chip 1 containing such a ball 9c.

Figure 5A:
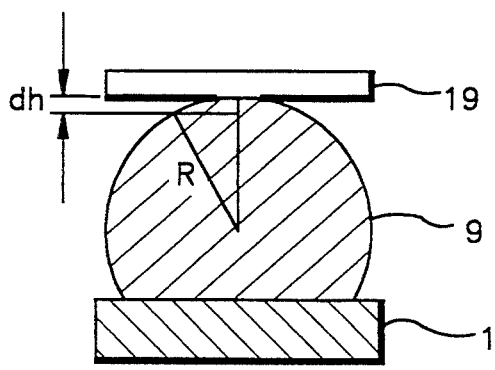
FIGS. 5A and 5B show the dimensions of flats measured on two balls respectively flattened slightly and to a greater extent by the transparent strip.
Figure 5B:
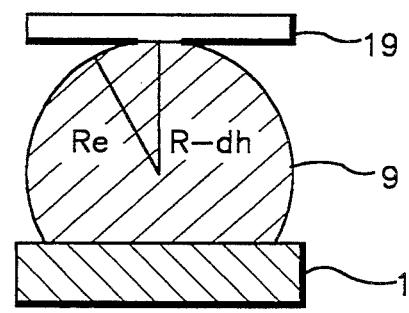

FIGS. 5A and 5B show the ball 9 of the chip 1 against the transparent strip 19. In FIG. 5A the ball 9 is simply in contact with the transparent strip 19, whereas in FIG. 5B the ball 9 is flattened on the transparent strip 19. FIG. 5A shows that the ball 9 only has a very slight flat, because it is simply in contact with the transparent strip 19. However, in FIG. 5B, the ball 9 is flattened against the transparent strip 19, which creates a larger flat on the ball 9.

FIG. 5A shows the radius R of the ball. It is also possible to see a height difference dh between the contact point of the ball on the strip in FIG. 5A and that in FIG. 5B. This height difference dh gives rise to the flattening of the ball 9 in FIG. 5B.

In FIG. 5B, Re is the radius of the ball at the end point of the flat, R−dh the radius of the ball at the central point of the flat and rm the radius of the flat. In this case, the relation between the flat radius and the radius of the ball 9 is $$rm^2 = Re^2 - (-dh)^2$$

In the particular case where the value rm of the flat is small, it is possible to liken the radius Re of the ball at the end point of the flat to the radius of the ball R, which makes it possible to easily determine the radius of the ball R as a function of the radius of the flat rm and of the flattening dh.

Figure 6:
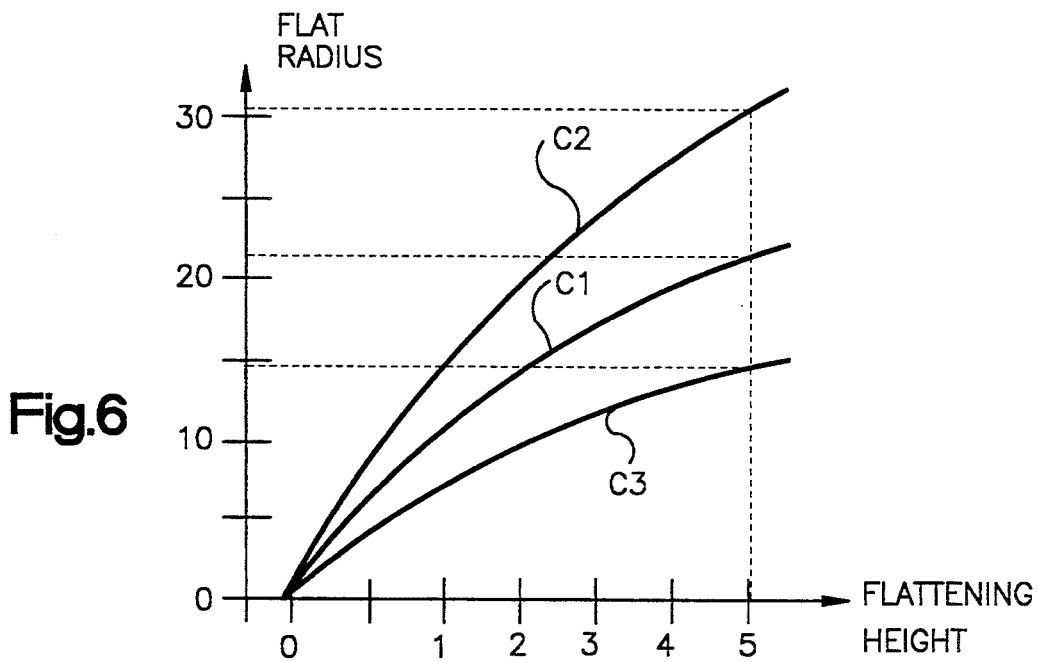
FIG. 6 shows the representative curves of the relation between the flattening and the flat created by the flattening for balls having different heights.

FIG. 6 shows three curves C1, C2 and C3 representing the radius of the flat in micrometers (on the ordinate) compared with the flattening height dh in micrometers (on the abscissa) of a ball against the transparent strip. On curve C1 is represented the radius of the flat obtained for a 50 micrometer high ball as a function of the chosen flattening height. On curve C2 is shown the radius of the flat of a ball of approximately 100 micrometers as a function of the flattening heights of the ball against the transparent strip. In a similar manner, the curve C3 shows the evolution of the radius of the flat of an approximately 25 micrometer ball as a function of the flattening height of said ball against transparent strip. For a ball with a height of approximately 50 micrometers, it is possible to gather from the curve C1 a flat radius of approximately 22 micrometers for a flattening height of approximately 5 micrometers. For the same 5 micrometer flattening height, it is possible to gather from curve C2 that the radius of the flat obtained on the 100 μm ball is approximately 32 micrometers. It is also possible to gather from the curve C3 that for a similar 5 micrometer flattening height, the flat radius is approximately 15 micrometers. Thus, for a given flattening height, it is possible to link the flat size with the ball height.

Using such a method, the measuring accuracy with respect to the ball height is significant and can be approximately 1 micron.

Therefore this process makes it possible to verify the presence and/or calculate the height of balls having in particular a size between 10 and 300 micrometers. Such a check can be carried out at a speed of 150 milliseconds/ball, which shows the interest of such a process in industry.

We claim:

1. Process for checking conformity of hybridization balls present on one face of an electronic component or a substrate, said process comprising the steps of:
   a) positioning the hybridization balls of the electronic component or substrate near a strip transparent to a wavelength $\lambda$;
   b) partially flattening said hybridization balls against the strip by positioning the electronic component or substrate at a previously defined distance from the strip, said previously defined distance corresponding to a theoretical reference ball height less a deviation between said theoretical reference ball height and a minimum allowable height of the hybridization balls, said flattening creating ball flats on said hybridization balls at the strip;
   c) illuminating the hybridization balls with a light beam of wavelength $\lambda$ through the strip;
   d) acquiring a portion of said light beam reflected back through the strip by the hybridization balls to be checked; and
   e) determining conformity or non-conformity of the hybridization balls to be checked as a function of the portion of said light beam reflected back through the strip by each of the hybridization balls to be checked.

2. Process according to claim 1, wherein step c) comprises illuminating an assembly of the electronic component or substrate by the light beam and wherein step d) comprises acquiring the portion of the light beam reflected by said assembly.

3. Process according to claim 1, wherein step c) comprises illuminating part of the electronic component or substrate by the light beam, said part being liable to have at least one of the hybridization balls and wherein step d) comprises acquiring the corresponding portion of the light beam reflected by said part of the electronic component or substrate, Steps c), d) and e) being repeated so as to check an entire assembly of the electronic component or substrate.

4. Process according to claim 1, wherein step e) of determining the conformity of the hybridization balls comprises detecting, from the acquired reflected portion of the light beam, a presence or absence of one of said ball flats corresponding with a hybridization ball at different locations expected to be occupied by the hybridization balls.

5. Process according to claim 1, wherein step e) of determining the conformity of the hybridization balls comprises detecting, from the acquired reflected portion of the light beam, at different locations expected to be occupied by the hybridization balls, a presence or absence of one of said ball flats and measuring, in a case of the presence of a ball flat, a size of a corresponding hybridization ball.

6. Device for checking dimensions of hybridization balls mounted on one face of an electronic component or a substrate, said device comprising:
   a strip transparent to wavelength $\lambda$;
   a loading table on which is placed the electronic component or substrate with the one face of said electronic component or substrate, on which the hybridization balls are mounted, facing the strip;
   means for displacing the loading table toward the strip to a previously defined distance from said strip in order to ensure partial flattening of the hybridization balls against the strip said previously defined distance corresponding to a theoretical reference ball height less a deviation between said theoretical reference ball height and a minimum allowable height of the hybridization balls;
   optical means for respectively emitting a light beam at wavelength $\lambda$ to illuminate the hybridization balls to be checked of the electronic component or substrate through the strip and acquiring a portion of the light beam which is reflected back through the strip by the electronic component or substrate and the hybridization balls; and
   processing means electrically connected to said displacement means and said optical means for controlling the displacement means and determining conformity or non-conformity of the hybridization balls to be checked.

7. Device according to claim 6, further comprising means for orienting the optical means in a plane parallel to the one face of the electronic component or substrate, on which the hybridization balls are mounted, in order to direct the light beam towards the hybridization balls to be checked, said orientation means being electrically connected to and controlled by the processing means.

8. Device according to claim 6, further comprising means for automatic loading of the electronic component or substrate on the loading table, said loading means being electrically connected to and controlled by the processing means.

9. Device according to claim 6, wherein said strip transparent to the wavelength $\lambda$ has a first plate transparent to said wavelength $\lambda$ and a second plate transparent to said wavelength $\lambda$ deposited on a first face of said first plate, the first plate being less thick than the second plate, a second face of the first plate .Opposite said first face being contactable with the hybridization balls.

10. Device according to claim 6, wherein said optical means comprises an axial light source for emitting a generally collimated light beam to illuminate the hybridization balls to be checked and a CCD camera coupled to said light source in order to acquire the portion of the light beam which is reflected back through the strip.

11. Device according to claim 6, wherein said processing means comprises a memory in which are stored previously defined locations expected to be assumed by the hybridization balls on the electronic component or substrate.

* * * * *

UNITED STATES PATENT AND TRADEMARK OFFICE
CERTIFICATE OF CORRECTION

PATENT NO. : 5,450,206
DATED : September 12, 1995
INVENTOR(S) : Caillat et al.

It is certified that error appears in the above-indentified patent and that said Letters Patent is hereby corrected as shown below:

On the title page, item: [73] Assignee, the correct name of the Assignee should be --Commissariat A L'Energie Atomique--.

Column 8, line 28, delete "$rm^2=Re^2-(-dh)^2$" and insert --$rm^2=Re^2-(R-dh)^2$--.

Column 9, line 42 (Claim 3, line 7) delete "Steps" and insert --steps--.

Column 10, line 46, (Claim 9, line 6) delete "plate.Opposite" and insert --plate opposite--.

Signed and Sealed this

Twenty-seventh Day of February, 1996

Attest:

BRUCE LEHMAN

*Attesting Officer*  *Commissioner of Patents and Trademarks*